(12) United States Patent
Devaux et al.

(10) Patent No.: US 10,884,657 B2
(45) Date of Patent: Jan. 5, 2021

(54) COMPUTING DEVICE WITHIN MEMORY PROCESSING AND NARROW DATA PORTS

(71) Applicant: UPMEM, Grenoble (FR)

(72) Inventors: Fabrice Devaux, La Conversion (CH); Jean-François Roy, Grenoble (FR)

(73) Assignee: UPMEM, Grenoble (FR)

( * ) Notice: Subject to any disclaimer, the term of this patent is extended or adjusted under 35 U.S.C. 154(b) by 12 days.

(21) Appl. No.: 15/763,970

(22) PCT Filed: Sep. 27, 2016

(86) PCT No.: PCT/FR2016/052450
§ 371 (c)(1),
(2) Date: Mar. 28, 2018

(87) PCT Pub. No.: WO2017/055732
PCT Pub. Date: Apr. 6, 2017

(65) Prior Publication Data
US 2018/0260161 A1 Sep. 13, 2018

(30) Foreign Application Priority Data

Oct. 1, 2015 (FR) .................................... 15 59321
Jan. 11, 2016 (FR) .................................... 16 50186

(51) Int. Cl.
*G06F 3/06* (2006.01)
*G06F 13/16* (2006.01)
(Continued)

(52) U.S. Cl.
CPC .......... *G06F 3/0659* (2013.01); *G06F 3/0604* (2013.01); *G06F 3/0673* (2013.01);
(Continued)

(58) Field of Classification Search
CPC .... G06F 3/0659; G06F 3/0604; G06F 3/0673; G06F 11/1068; G06F 13/1678; G06F 13/128; G06F 13/4018; G11C 29/52
See application file for complete search history.

(56) References Cited

U.S. PATENT DOCUMENTS 5,745,791 A  4/1998 Peek et al.
5,758,108 A  5/1998 Nakamura
(Continued)

FOREIGN PATENT DOCUMENTS

EP  0976054 A1  2/2000
WO  96/35176 A1  11/1996

OTHER PUBLICATIONS

EP 0976054 A1 (Advanced Micro Devices Inc [US]) Feb. 2, 2000 (Year: 2000).*

(Continued)

*Primary Examiner* — April Y Blair
*Assistant Examiner* — Rong Tang
(74) *Attorney, Agent, or Firm* — Phillips Winchester (57) ABSTRACT

A computer device comprises a first processor; a plurality of memory circuits, a first one of which comprises one or more other processors; a data bus coupling the first processor to each of the memory circuits, each of the memory circuits having a data port with a width of m bits and the data bus having a width of n bits, n being higher than m, the first processor and/or another circuit being suitable for reading or writing the data value of n bits in the first memory circuit by converting a first address into a plurality of second addresses corresponding to memory locations of m bits in the first memory circuit, and by performing the reading or writing operation of the data value of n bits in the first memory circuit over a plurality of memory access operations.

19 Claims, 7 Drawing Sheets

(51) Int. Cl.
*G06F 13/12* (2006.01)
*G06F 13/40* (2006.01)
*G06F 11/10* (2006.01)
*G11C 29/52* (2006.01)

(52) U.S. Cl.
CPC ........ *G06F 11/1068* (2013.01); *G06F 13/128* (2013.01); *G06F 13/1678* (2013.01); *G06F 13/4018* (2013.01); *G11C 29/52* (2013.01)

(56) References Cited

U.S. PATENT DOCUMENTS

2003/0037190 A1* 2/2003 Alexander .......... G06F 13/4018
 710/52
2003/0222283 A1 12/2003 Takazawa et al.
2013/0262786 A1* 10/2013 Takashima .............. G06F 12/00
 711/147

OTHER PUBLICATIONS

International Search Report for PCT/FR2016/052450 dated Jan. 2, 2017.

* cited by examiner

COMPUTING DEVICE WITHIN MEMORY PROCESSING AND NARROW DATA PORTS

PRIORITY CLAIM

The present patent application claims priority of the French patent applications FR15/59321 and FR16/50186 that will be considered as an integral part of the present disclosure.

BACKGROUND OF THE INVENTION

The present disclosure relates to the field of "in memory processing", and in particular to a computing device and method involving memory circuits having one or more processors and a narrow width data bus.

Modern computers generally comprise a processing circuit, often implemented as a system on chip (SoC), coupled to one or more dynamic random access memory (DRAM) circuits. Such memories, which generally require a periodic refresh operation, are dense and relatively fast to access, and are thus used as the main RAM data storage in most computers. However, in view of the ever increasing amounts of data to be transferred between the SoC and DRAM circuits, such data transfers tend to slow the operation of the computer and lead to a relatively high energy consumption.

A solution that has been proposed is to provide DRAM circuits having one or more processors integrated therein, in addition to the main host processors in the SoC. Such a solution reduces the level of data transfer between the DRAM circuit and the host processors by allowing certain data processing tasks to be delegated to the DRAM processors, so that these processing tasks can be performed while avoiding data transfer between the DRAM circuit and the host processors.

A difficulty in using a data processor within a memory chip is that each memory chip may not see the full bus width of the host processor. Indeed, it is common practice to provide a series of memory chips each coupled to a corresponding slice of the host processor data bus. Advantages of such slicing of the data bus include the fact that the chip packages can have relatively narrow data ports, implying less pins, and thus reduced energy consumption. Furthermore, narrow data ports enable large-capacity memory systems to be constructed without requiring extra buffer chips, the use of which would increase cost, power consumption, latency and decrease the operating frequency and thus the bandwidth. In view of the narrow data port of each memory chip, a processor of the memory chip will be unable to process data supplied across the full width of the host processor.

There is thus a technical problem in the art for providing a system permitting in-memory processing in memory chips having narrow data buses.

SUMMARY OF THE INVENTION

It is an aim of embodiments of the present disclosure to at least partially address one or more problems in the prior art.

According to one aspect, there is provided a computing device comprising: a first processing device; a plurality of memory circuits, at least a first of the memory circuits comprising one or more further processing devices; a data bus coupling the first processing device to each of the memory circuits, wherein each of the memory circuits has a data port that is m bits wide and the data bus has a width of n bits, where n is larger than m, the data port of each of the memory circuits being coupled to a corresponding m-bit slice of the data bus, the first processing device being adapted to provide one or more first addresses for an n-bit data value to be read or written via the data bus, wherein the first processing device and/or a further circuit is adapted to read or write the n-bit data value from or to the first memory circuit by converting the first address into a plurality of second addresses corresponding to m-bit memory locations in the first memory circuit, at least two of the plurality of second addresses being contiguous addresses; and performing the read or write operation of the n-bit data value to the first memory circuit over a plurality memory access operations.

According to one embodiment, each further processing device comprises one or more processors configured to perform data processing operations stored by the first memory circuit based on commands provided by the first processing device.

According to one embodiment, the width n of the data bus is a multiple p of the width m of the data port of each memory circuit, and wherein there are p memory circuits.

According to one embodiment, the address conversion comprises an address permutation such that one or more of the most significant bits of the one or more first addresses become one or more least significant bits of the plurality of second addresses designating the first memory circuit.

According to one embodiment, the one or more first addresses are addresses in an address space of the first processing device, and the plurality of second addresses are addresses in a local address space of the one or more further processing devices, wherein the local address space is linear or linear by segment.

According to one embodiment, the computing device further comprising a data cache, and a data permutation circuit adapted to perform a cache line permutation on one or more lines of the data cache, the data cache having cache lines each storing a plurality of data words, each data word comprising a plurality of bytes of data, and wherein the cache line permutation stores the bytes forming a first of the data words in storage locations of the cache associated with the first memory circuit.

According to one embodiment, the data cache is coupled to the memory circuits via a data bus, and wherein the data permutation circuit is a byte transposition circuit coupled between the data bus and the data cache and adapted to perform the cache line permutation of each data value stored to or loaded from the cache.

According to one embodiment, the first processing device and/or a further circuit is adapted to determine whether the one or more first addresses falls within an address segment associated with one or more of the further processing devices, and to perform said address conversion if the one or more first addresses falls within said address segment.

According to one embodiment, a plurality of least significant bits of the first address is identical to a plurality of least significant bits of one of the second addresses.

According to one embodiment, a command register of more than m bits is mapped to the address space of the first memory circuit, said command register comprising at least one control bit, wherein the first processing device is adapted to perform a write operation to the command register over a plurality of memory access operations, a byte of the command register comprising the control bit being written by a final one of the memory access operations and involving a modification of the control bit.

According to one embodiment, the first memory circuit is an integrated circuit chip integrating a memory array and said one or more further processing devices.

According to one embodiment, the first memory circuit comprises a first integrated circuit chip comprising a memory array and a further integrated circuit chip comprising said one or more further processing devices.

According to one embodiment, the first memory circuit comprises a plurality of further processing devices each associated with a corresponding address space of the memory array.

According to one embodiment, the first processing device comprises one or more error correction code (ECC) circuits adapted to insert one or more ECC bits into each m-bit value.

According to one embodiment, the first processing device comprises one or more error correction code (ECC) circuits adapted to generate ECC bits to be stored to the first memory circuit during a further memory access operation.

According to another aspect, there is provided a method comprising: performing, by a first processing device, a read or write operation of an n-bit data value to or from a first memory circuit of a plurality of memory circuits via a data bus coupling the first processing device to each of the memory circuits, the first memory circuit comprising one or more further processing devices, wherein each of the memory circuits has a data port that is m bits wide and the data bus has a width of n bits, where n is larger than m, the data port of each of the memory circuits being coupled to a corresponding m-bit slice of the data bus, the read or write operation comprising: providing, by the first processing device, one or more first addresses for an n-bit data value to be read or written via the data bus; converting the first address into a plurality of second addresses corresponding to m-bit memory locations in the first memory circuit, at least two of the plurality of second addresses being contiguous addresses; and performing the read or write operation of the n-bit data value to the first memory circuit over a plurality memory access operations.

According to one embodiment, the method further comprises the performance by the first processing device, of a cache line permutation on one or more lines of a data cache, the data cache having cache lines each storing a plurality of data words, each data word comprising a plurality of bytes of data, and wherein the cache line permutation store the bytes forming a first of the data words in storage locations of the cache associated with the first memory circuit.

According to another aspect, there is provided an electronic storage medium storing program instructions which, when executed by a first processing device, lead to the implementation of the aforementioned method.

According to another aspect, there is provided a computer system where a host processor is connected to one or several memory chips, these memory chips integrating one or several data processors, the connection between these memory chips and the host processor being done by a data bus wider than the data port of these memory chips, these memory chips being connected to the data bus in a data parallel fashion to accommodate the data bus width.

According to one embodiment, a linear, or linear by segment, address space, is defined, this address space enabling to access linearly, or linearly by segment, the memory of each memory chip.

According to one embodiment, an address conversion function between this new address space and the original address space of the host processor, enables the host processor to access this new address space.

According to one embodiment, the address conversion function is implemented directly in hardware.

According to one embodiment, the address conversion hardware function is configurable, and this function changes according to configurable memory segments.

According to one embodiment, the new address space comprises itself sub-address spaces, these sub-address spaces being used by the data processors integrated into the memory chips, providing them a linear, or linear by segment, access to their accessible memories.

According to one embodiment, these sub-address spaces are linearly, or linearly by segment, mapped into the new address space.

According to one embodiment, the host processor has a data cache, or a universal cache equally acting as a data cache, and a cache line permutation is done in order to change the address conversion function, and make this later linear by segment, enabling the host processor to correctly access the memory accessible to the data processor integrated into the memory chips, when the host processor uses load, store, or any instruction accessing the memory, whose memory access width is wider than the data port of the concerned memory chips.

According to one embodiment, the cache line permutation is done entirely by software.

According to one embodiment, the cache line permutation is done entirely by hardware.

According to one embodiment, the cache line permutation is partially done by software, partially done by hardware.

According to one embodiment, the burst data pattern corresponds natively to the cache line permutation, this being equivalent to having always a cache line permutation when the cache line is loaded from, or stored to, memory.

According to one embodiment, several types of cache line permutations are supported, and configuration means enable to specify address segments, and which kind of cache line permutation has to be done when an access is inside one of these segments.

According to one embodiment, the memory chips integrate one or several command registers wider than the memory chip data port, a command colour scheme is used, a change in command colour being requested for a new command to be valid in the concerned command register.

According to one embodiment, the host processor is a system on chip comprising several processor cores.

According to one embodiment, the host processor is a system on chip comprising several memory buses.

According to a further embodiment, there is provided a larger system comprising several systems, each as defined above, connected together and belonging to a same cache coherency domain, in order to build a multi-socket server.

According to one embodiment, each given memory chip is enlarged, both in memory capacity and in data port width, in order to allow the transfer, during the totality of a burst transaction, of an ECC code covering the totality of the non-enlarged data transferred during this burst transaction from, or to, this given memory chip.

According to one embodiment, each given memory chip is enlarged in memory capacity in order to be able to store ECC, burst transactions are lengthened allowing the transfer of an ECC code during a burst transaction, such that the transferred ECC code protect the totality of the non ECC data transferred, from, or to, this given memory chip during a burst transaction.

According to one embodiment, the data processor is not integrated into the memory chips, but into one or several additional circuits, placed between the host processor and the memory chips.

According to one embodiment, the address conversion and/or cache line permutation is/are partially or entirely done inside one or several additional circuits placed between the host processor and the memory chips.

According to one aspect, there is provided a computing device comprising: a first processor; a plurality of memory devices, at least a first of the memory devices integrating one or more further processors; a data bus coupling the first processor to each of the memory devices, wherein each of the memory devices has a data port m bits wide and the data bus has a width of n bits, where n is larger than m, the first processor being adapted to provide a first address for an n-bit data value to be read or written via the data bus, wherein the first processor and/or a further circuit is adapted read or write the n-bit data value to or from the first memory device by: converting the first address into a plurality of addresses corresponding to m-bit memory locations in the first memory device, at least two of the plurality of addresses being contiguous addresses; and performing the read or write operation of the n-bit data value to the first memory device over a plurality memory access operations.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the following description, the following terms as used herein will be considered to have the following definitions:

memory chip: an integrated circuit comprising a memory array, such as a DRAM (dynamic random access memory) array or other type of random access memory array;

data processing unit (DPU): a processing device comprising one or more processors integrated in a memory chip or otherwise associated with a memory chip;

memory circuit: a circuit comprising a memory chip, and which may comprise one or more data processing units integrated in the memory chip or otherwise associated with the memory chip; and host central processing unit (HCPU): a main processing device of a computing device comprising one or more processors configured to read and write data to memory circuits via a data bus.

Figure 1:
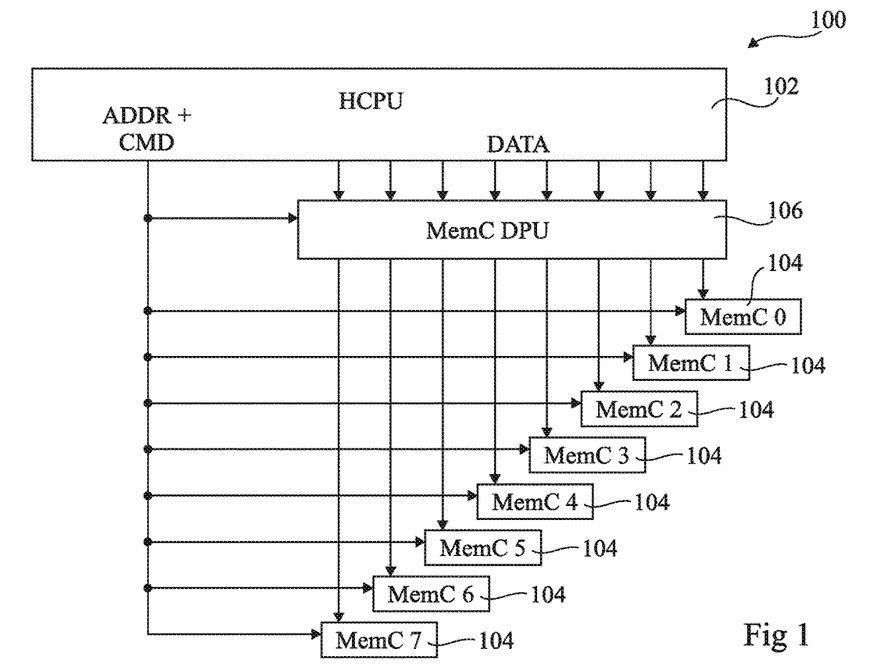
FIG. 1 schematically illustrates an example of a computing device.

FIG. 1 schematically illustrates a computing device 100 according to an example embodiment. The computing device 100 for example comprises a main processor 102, referred to herein as a host central processing unit (HCPU). The HCPU 102 is for example coupled to memory circuits 104. In the example of FIG. 1, there are 8 memory circuits labelled MemC 0 to MemC 7.

Each of the memory circuits 104 for example has a data port that is narrower than the width of the data bus of the HCPU, and each data port is coupled to part of the data bus of the HCPU 102. In one example, the data bus is 64 bits wide, and each of the memory circuits 104 has a data port coupled to a corresponding 8-bit slice of the data bus. As mentioned above, an advantage of providing memory circuits with data ports that are narrower than the width of the data bus of the HCPU 102 is that narrower data ports use less pins, leading to economies in chip area and power consumption. Furthermore, narrow data ports enable large-capacity memory systems to be constructed without requiring extra buffer chips, the use of which would increase cost, power consumption, latency and decrease the operating frequency and thus the bandwidth.

Thus, when data words of 64 bits are written to the memory circuits, each memory circuit 104 stores only part of the data word. This means that if one or more of the memory circuits 104 comprises a data processing unit for performing data processing in addition to the HCPU 102, such a data processing unit will only see a portion of each data word stored to memory, and will therefore not be able to perform any meaningful operation.

As an example, it is assumed that a processing device is to be integrated into each of the memory circuits 104 in order to allow a simple count function to be performed. Furthermore, it is assumed that the memory circuits MemC 0 to MemC 7 are mapped starting at the address 0x04000000, where the preamble "0x" indicates that the value is represented in hexadecimal. The HCPU 102 writes a 64-bit word, called counter, into the main memory formed by the memory circuits 104 at the address 0X04000000. The HCPU then wants a DPU of the memory circuit MemC 0 to implement a count function by incrementing the 64-bit word counter. However, this DPU will see only a portion [7:0] of the 64-bit word, and will thus be unable to perform the desired function. Similarly, the DPU of any other memory circuit will likewise see only a portion of the 64-bit word, and will thus be unable to perform the desired function.

As illustrated in FIG. 1, a further memory circuit (MemC DPU) 106 may comprise a DPU, and have a data port equal in width to that of the data bus of the HCPU 102. This memory circuit 106 may store the entire words provided on the data bus of the HCPU, and thus the DPU of this circuit may perform operations on entire data words, including the count function mentioned above. However, given its wide data port, this memory circuit 106 will use a high number of pins, and will thus not have the advantages associated with narrow data ports as described above.

Figure 2:
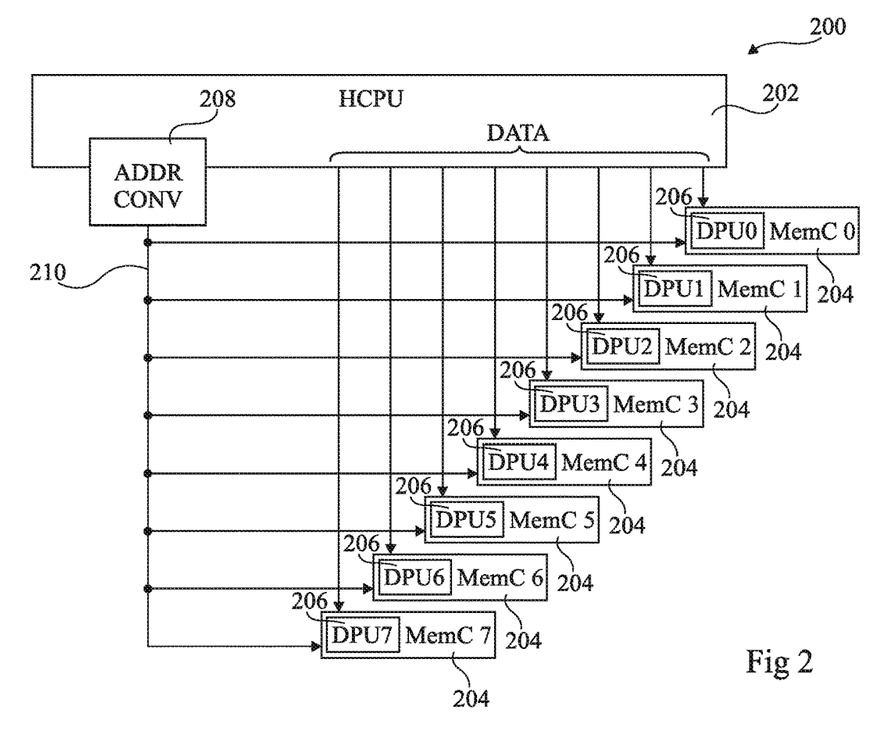
FIG. 2 schematically illustrates a computing device according to an example embodiment of the present disclosure.

FIG. 2 schematically illustrates a computing device 200 according to an example embodiment of the present disclosure.

The computing device 200 comprises an HCPU 202 coupled to a plurality of memory circuits 204. In the example of FIG. 2, there are 8 memory circuits labelled MemC 0 to MemC 7. Each of the memory circuits 204 comprises a DPU 206, the DPUs in the memory circuits MemC 0 to MemC 7 being respectively labelled DPU0 to DPU7 in FIG. 2. The memory circuits 204 each for example receives a corresponding slice of the data bus of the HCPU 202. In one example, the data bus of the HCPU 202 is 64 bits wide, and will be represented herein by data_bus[63:0]. The bits of this data bus are for example sliced among the memory circuits 204 as follows:

the data port of MemC 0 is connected to data_bus[7:0];
the data port of MemC 1 is connected to data_bus[15:8];
the data port of MemC 2 is connected to data_bus[23:16];
the data port of MemC 3 is connected to data_bus[31:24];
the data port of MemC 4 is connected to data_bus[39:32];
the data port of MemC 5 is connected to data_bus[47:40];
the data port of MemC 6 is connected to data_bus[55:48];
the data port of MemC 7 is connected to data_bus[63:56];

An address conversion function (ADDR CONV) 208 is, for example, implemented either by hardware and/or software in the HCPU 202, or by a separate circuit. This conversion function 208 converts addresses from the HCPU address space into particular addresses in the physical global address space (PGAS) employed by the memory circuits 204, such that a data word that would otherwise be present across the width of the HCPU data bus and partially by each memory circuit 204 is instead stored entirely by one of the memory circuits. The converted PGAS address is for example provided to the memory circuits 204, along with the appropriate read or write command signals, on an address and command bus 210 coupled to each of the memory circuits 204. The address conversion function 208 will now be described in more detail with reference to FIGS. 3 to 6.

Figure 3:
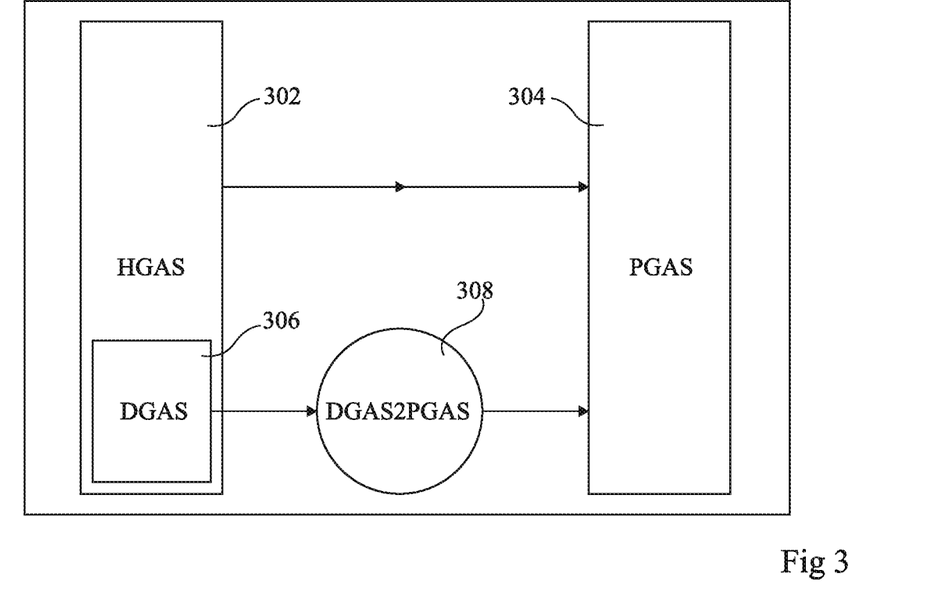
FIG. 3 schematically illustrates memory address spaces in the computing device of FIG. 2 according to an example embodiment.

FIG. 3 schematically represents the address conversion function 210 according to an example embodiment. According to this example, a HCPU global address space (HGAS) 302 is defined, which is the address space seen and used by the HCPU 202. The physical global address space (PGAS) 304 is used to address the physical memory system.

According to the embodiments described herein, HGAS and PGAS are defined differently for at least some ranges in the HGAS address space. For example, the HGAS 302 comprises a sub-address space 306 shown in FIG. 3, which is a DPU global address space.

When an HGAS address is outside the DGAS region 306, the corresponding PGAS address is given directly by the value of this HGAS address. In other words, no address conversion is necessary.

However, when an HGAS address is inside the DGAS region 306, address conversion is performed in order to generate the PGAS address. For example, the PGAS address is generated by a function 308 that we will call herein DGAS2PGAS.

In some embodiments, the entire HGAS 302 may correspond to DGAS 306, meaning that DPUs of the memory circuits may access the full address space of the memory circuits 204.

The DGAS 306 comprises address ranges assigned to each DPU and accessible to ir, as will now be described with reference to FIG. 4.

Figure 4:
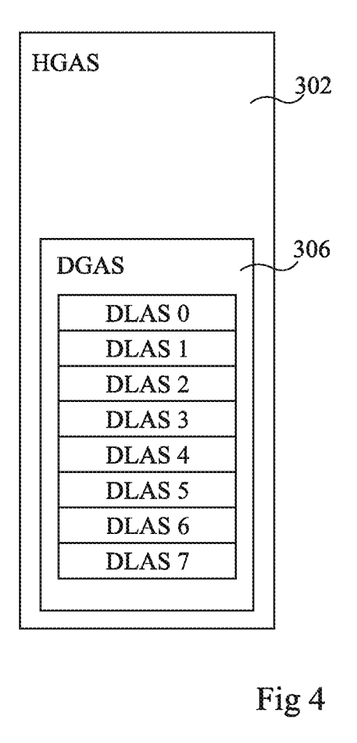
FIG. 4 schematically illustrates a host processor memory address space of FIG. 3 in more detail according to an example embodiment.

FIG. 4 schematically illustrates the HCPU global address space 302 in more detail, and in particular illustrates that the DGAS 306 may comprise zones DLAS0 to DLAS7 of memory addresses corresponding to DPU local address spaces (DLAS) of each of the DPUs of the memory circuits. The DLAS of each DPU is for example an address space that is linear, or linear by segment. This means that incrementing the address by one will access an adjacent memory byte in the same memory circuit for at least a portion of addresses of the memory circuit. This is not the case when a word is stored over a number of different memory circuits, as in such a case incrementing the address by one will cause a different memory circuit to be addressed.

FIG. 4 corresponds to the example of FIG. 2 in which there are 8 memory circuits, with 8 corresponding DPUs, and thus there are 8 DLAS (DLAS0 to DLAS7). Of course, in alternative embodiments, there could be a different number of local address spaces based on the number of DPUs present in the memory circuits and based on the number of memory circuits.

For example, in one embodiment, the local address spaces DLAS 0 to DLAS 7 are mapped to the following memory portions of the memory system, assuming that each of the memory circuits is 8 MB (mega bytes) in size, and thus the total physical memory is 64 MB in size:

DLAS 0 is mapped to the physical addresses 0 to 8 MB-1, where the representation X MB-1 means one byte less than X megabytes;
DLAS 1 is mapped to the physical addresses 8 to 16 MB-1;
DLAS 2 is mapped to the physical addresses 16 to 24 MB-1;
DLAS 3 is mapped to the physical addresses 24 to 32 MB-1;
DLAS 4 is mapped to the physical addresses 32 to 40 MB-1;
DLAS 5 is mapped to the physical addresses 40 to 48 MB-1;
DLAS 6 is mapped to the physical addresses 48 to 56 MB-1;
DLAS 7 is mapped to the physical addresses 56 to 64 MB-1.

Thus the memory circuit MemC 0 contains the first 8 MB of the physical address space, the memory circuit MemC 1 contains the second 8 MB of the physical address space, etc. An advantage of such a mapping is that each DPU can access a continuous address space. However, this mapping of the DPU local address spaces to the physical addresses is merely one example, and other types of mapping would be possible. For example, the physical addresses could be 4 MB blocks, wherein:

DLAS 0 is mapped to the physical addresses 0 to 4 MB-1 and 32 to 36 MB-1;
DLAS 1 is mapped to the physical addresses 4 to 8 MB-1 and 36 to 40 MB-1; etc., up to:
DLAS 7 is mapped to the physical addresses 28 to 32 MB-1 and 60 to 64 MB-1.

Figure 5:
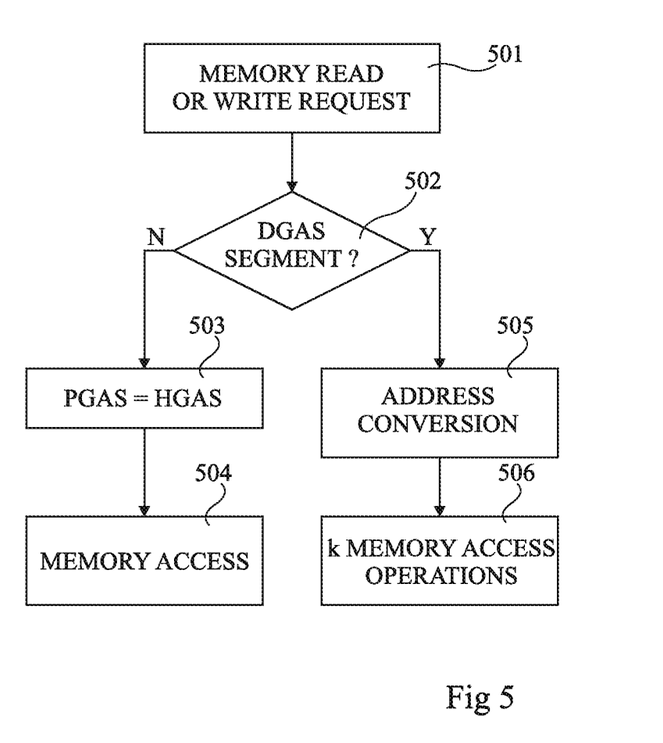
FIG. 5 is a flow diagram illustrating operations in a method of performing a read or write operation according to an example embodiment.

FIG. 5 is a flow diagram illustrating operations in a method of accessing a memory according to an example embodiment of the present disclosure. The method is for example implemented by the HCPU 202 and/or a circuit implementing the address conversion function 208. In particular, the method may be implemented exclusively by the HCPU in the case that the address conversion function 208 is implemented in software executed by one or more processors of the HCPU. Alternatively, the method may be implemented by a dedicated circuit in the case that the address conversion function 208 is implemented by hardware separate from the HCPU 202.

In an operation 501, a memory read or write request is generated. For example, the HCPU 202 generates this memory read or write request by executing a load or store instruction.

In an operation 502, it is determined whether the memory read or write request involves an address falling within a DGAS segment. In other words, it is determined whether the address corresponds to the zone of memory labelled as 306 in FIGS. 3 and 4, which should be converted in order to generate the physical address. For example, the address conversion function 208 stores an indication of the address ranges corresponding to the DGAS 306.

In some embodiments, the HCPU 202 is enhanced in order to implement the DGAS2PGAS function without or with low performance cost. For example, the HCPU comprises a plurality of configuration registers allowing the special address segment DGAS to be created within the HGAS. For example, these configuration registers store the boundaries of the DGAS segment, or of each DGAS segment in the case that there are a plurality of non-contiguous DGAS segments. Furthermore, the configuration registers for example indicate the transformation to be performed for address conversion. Indeed, this conversion depends on the particular memory circuits that are used, and in particular on the width of the data ports of the memory circuits. When the HGAS address is inside the DGAS segment, the address is in fact a DGAS address, and thus it should be converted into a PGAS address.

If the address is not within a DGAS segment, in an operation 503, it is assumed that the physical global address space (PGAS) is equal to the DPU global address space (DGAS), and therefore in a subsequent operation 504, the memory access is processed based on the HGAS address.

Alternatively, if in operation 502 it is determined that the read or write request involves an address falling within a DGAS segment, the next operation is 505, in which address conversion is performed using the DGAS2PGAS function, an example of which will now be described in more detail with reference to FIG. 6.

Figure 6:
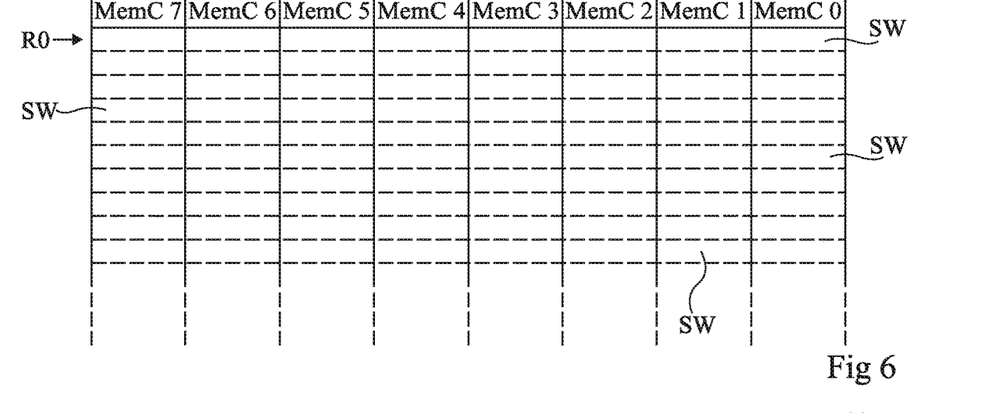
FIG. 6 schematically represents a distribution of data bytes in memory circuits according to an example of the present disclosure.

FIG. 6 schematically illustrates an example of the physical address space of the memory system assuming the case of the 8 memory circuits MemC 0 to MemC 7. Each row of each memory circuit MemC 0 to MemC 7 stores a sub-word, which is for example one byte. Each word present on the 64-bit HCPU data bus is thus stored such that a sub-word (SW) is stored in each row. For example, a first row R0 spanning the memory system comprises a first 8-bit value stored in the memory circuit MemC 0, a second 8-bit value stored in the memory circuit MemC 1, etc. Thus, for addresses falling outside the DGAS 306 for which no address conversion is performed, each word in the HCPU address space is stored across each of the memory circuits of the memory system. In such a case, the address of each sub-word SW or byte is for example of the form [25:0], where the 23 bits [25:3] designate one row among the 8388608 rows of the memory system, and the final bits [2:0] designate the byte within the row.

However, for addresses falling within the DGAS 306, the following conversion function is for example applied between the address in the DGAS 302 and the PGAS address used to address the memory circuits:

PGAS_address[25:0]={DGAS_address[22:0],DGAS_address[25:23]}

Thus the most significant bits [25:23] of the DGAS address, which would otherwise indicate whether the row falls in the first, second, third, fourth, fifth, sixth, seventh or eighth group of 1048576 rows, now indicates which memory circuit is to be written to. Thus addresses normally falling in the first 1048576 rows will now be written to the memory cell MemC 0, the second 1048576 rows will be written to the memory cell MemC 1, etc.

Thus bytes forming a 64-bit data word in the DGAS 306 will, for example, all be written to or read from eight adjacent rows in one of the memory circuits. Thus reading or writing this 64-bit word is for example performed over eight consecutive read or write operations. In such a case, the DGAS address bits [2:0] can for example be omitted, and the memory circuits are for example capable of performing operations on successive address locations without requiring these address bits to be supplied. However, the DGAS address bit [2] is for example supplied when a 32-bit word is to be accessed, the DGAS address bits [1:0] are for example supplied when a 16-bit access is to be performed, and the DGAS address bits [2:0] are for example supplied when a specific byte is to be accessed.

This address conversion can, in some embodiments, be implemented by an address bit permutation that is performed automatically for the DGAS segment. For example, the nature of the bit permutation is specified by the content of the corresponding configuration registers. In some embodiments, the DGAS can be mapped into HGAS as a sum of several mapping segments, there being linearity by segment. Indeed, the DGAS is for example the sum of the DLAS segments in the memory circuits.

Referring again to FIG. 5, in a subsequent operation 506, k memory access operations are performed based on the converted physical addresses. For example, in some embodiments, the address of the read or write operation may correspond to a single byte of data, in which case this can be performed in a single read or write operation, and k is equal to 1. Alternatively, the read or write request may correspond to a word of data to be read or written, and in such a case there will be a sequence of 8 memory access operations performed in order to write the data to the corresponding DLAS zone in the memory, and k will be equal to 8. Other values of k are possible depending on the number of bytes designated by the address of the read or write operation.

Figure 7:
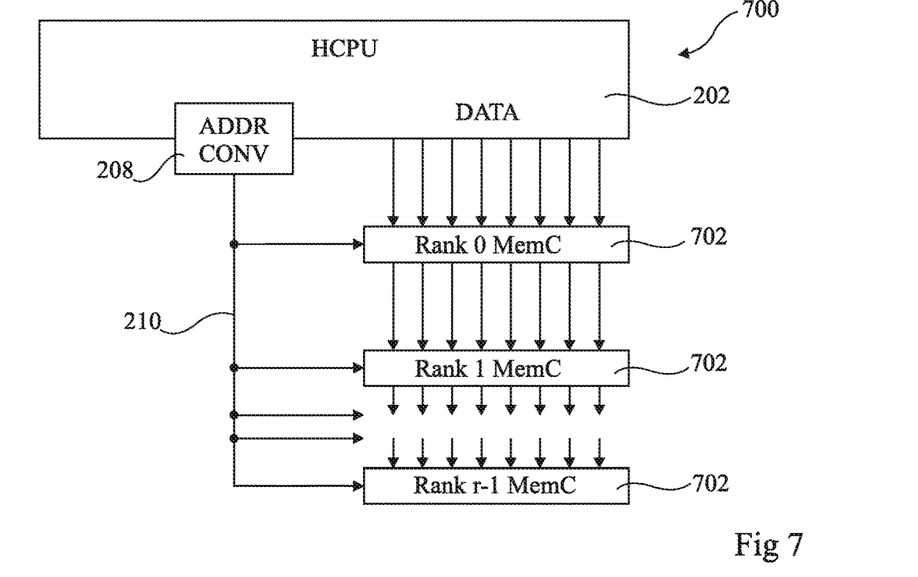
FIG. 7 schematically illustrates a computing device comprising a plurality of memory ranks according to an example embodiment of the present disclosure.

FIG. 7 illustrates a computing device 700, which is similar to the device 200 of FIG. 2, but instead of comprising a single rank of memory circuits 204, it comprises a plurality of ranks 702 of memory circuits. For example HCPU 202 communicates with a total of r ranks of memory circuits, these ranks being labelled Rank 0 MemC to Rank r-1

MemC. Each rank for example comprises a plurality of memory circuits. The data bus of the HCPU is coupled to each of the memory ranks, and the address conversion function 208 is for example applied independently for each rank. For example, in the case there are two ranks 0 and 1, the rank 0 for example comprises the DLAS zones 0 to 7, while the rank 1 for example comprises the DLAS zones 8 through to 15.

While in the embodiment of FIG. 2 each of the memory circuits 204 comprises a single DPU 206, in alternative embodiments, each memory circuit 204 may comprise a plurality of DPUs, as will be described with reference to FIGS. 8 and 9.

Figure 8:
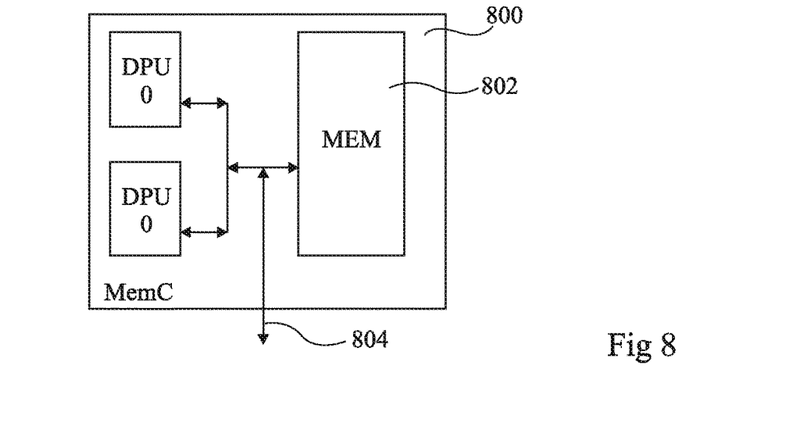
FIG. 8 schematically illustrates a memory circuit in more detail according to an example embodiment.

FIG. 8 schematically illustrates a memory circuit 800 as an alternative to each of the memory circuits 204 of FIG. 2. For example, the memory circuit 800 is a memory chip integrating a memory array (MEM) 802 and two DPUs labelled DPU 0 and DPU 1. The DPUs DPU 0 and DPU 1 and the memory array 802 are each for example coupled to a slice 804 of the HCPU bus. In this embodiment, each of the DPUs DPU 0 and DPU 1 for example shares the same DPU local address space and is for example capable of accessing the entire address space of the memory array 802. Similarly, the DPUs of each other memory circuit for example likewise share the same DLAS.

Figure 9:
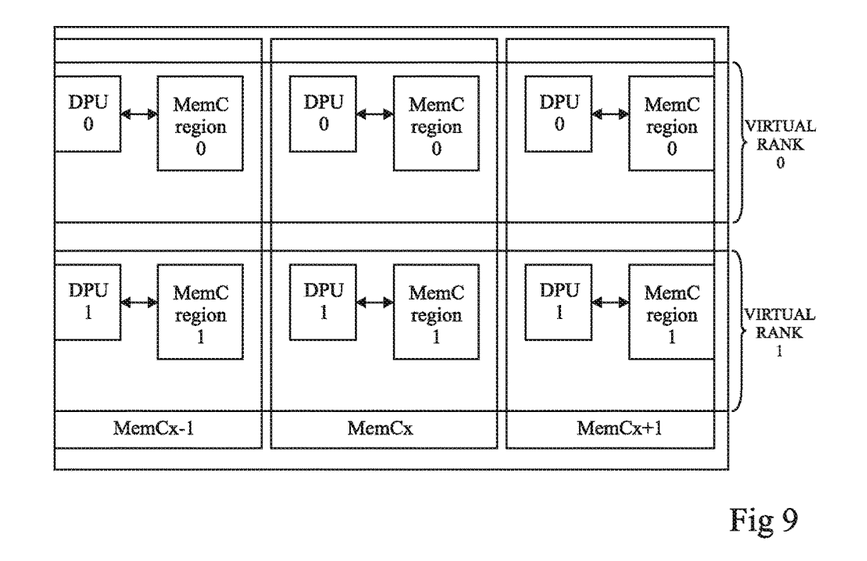
FIG. 9 schematically illustrates memory circuits having a plurality of virtual ranks according to an example embodiment.

FIG. 9 represents an alternative embodiment in which the memory of each memory circuit is divided into a plurality of regions. In the example of FIG. 9 three memory circuits MemC x-1, MemC x and MemC x+1 each comprise two regions, one labelled MemC region 0, and the other labelled MemC region 1. A DPU is associated with each memory region, and can only access that region. For example, the DPU 0 of each memory circuit can only access the region MemC region 0, and the DPU 1 of each memory circuit can only access the region MemC region 1. Thus, the regions 0 of the considered memory circuit can be considered as a virtual rank, and the regions 1 as another virtual rank, and the regions 0 and 1 are labelled as such in FIG. 9 as VIRTUAL RANK 0 and VIRTUAL RANK 1 respectively. Thus, rather than considering that each memory circuit comprises a plurality of DPUs, it is possible to simply consider that there are a plurality of ranks, and adopt the solution described above in relation with FIG. 7.

In alternative embodiments, each DPU may be capable of accessing a plurality of regions, but not all of the physical memory address space of the memory circuits is accessible by the DPUs. In such a case, a DLAS is for example defined for each accessible memory region, such that the associated DPU or DPUs can access it.

By implementing the address conversion function as an address bit permutation described above, the address conversion can be performed more or less transparently from a performance point of view. However, the HCPU still accesses the DGAS address space through byte-sized read and write operations. A more efficient conversion may be performed using burst memory accesses as will now be described in more detail with reference to FIGS. 10A and 10B.

Figure 10A:
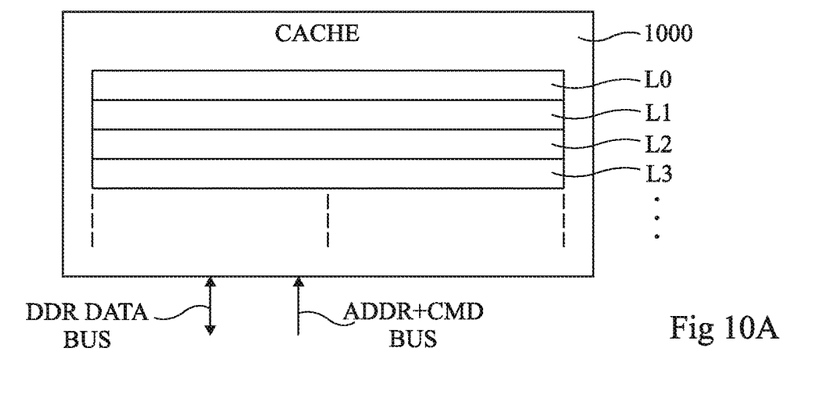
FIG. 10A schematically illustrates a data cache of the host processor of FIG. 2 according to an example embodiment of the present disclosure.

FIG. 10A schematically illustrates a data cache 1000 (CACHE) according to an example embodiment. A data cache permits data to be stored locally by a processing device and accessed rapidly. The data cache 1000 is for example integrated into the HCPU 202, and is for example coupled to a data bus (DDR DATA BUS) and to an address and command bus (ADDR+CMD BUS) of the HCPU 202. The data cache 1000 for example comprises cache lines L1, L2, L3, etc., the number of lines depending on the size of the cache. Each cache line is for example the size of a memory burst transaction. A memory burst transaction is for example a memory access operation that improves performance by allowing a fast read or write access to block of memory addresses.

For example, a burst write transaction involves a succession of write accesses, a first write access using an address generated by the HCPU, and the following write accesses using addresses automatically incremented, for example by the memory circuits, from the one used by the first write access, the size of the increment corresponding to the HCPU bus width in bytes.

Similarly, a burst read transaction involves a succession of read accesses, a first read access using an address generated by the HCPU, and the following read accesses using addresses automatically incremented from the one used by the first read access, the size of the increment corresponding to the HCPU bus width in bytes.

For example, according to the DDR3 (double data rate type 3) and DDR4 (DDR type 4) protocols, a burst transaction consists of eight successive accesses, each access moving 8 bytes of data. Consequently, the amount of data moved by the burst transaction is 64 bytes. Moreover, the address of the first access is for example aligned on a 64-byte boundary.

In some embodiments, the memory burst access is based on a square burst, which is one for which the width in bytes is equal to its depth in number of accesses.

In one example, the data cache 1000 operates based on the DDR3 or DDR4 protocol, and thus each cache line L1, L2, etc., is for example of 64 bytes. The DDR3 and DDR4 protocols use square bursts. Indeed, in the DDR3/DDR4 context, the HCPU 202 communicates with its memory through burst transactions each comprising 8×64-bit (8 byte) burst accesses, these accesses being called herein "burst access 0" to "burst access 7".

A read or write burst transaction, comprising 64 bytes designated herein as B00 through to B63, is for example organized as follow:

| burst access 0: | B00 | B01 | B02 | B03 | B04 | B05 | B06 | B07 |
| burst access 1: | B08 | B09 | B10 | B11 | B12 | B13 | B14 | B15 |
| burst access 2: | B16 | B17 | B18 | B19 | B20 | B21 | B22 | B23 |
| burst access 3: | B24 | B25 | B26 | B27 | B28 | B29 | B30 | B31 |
| burst access 4: | B32 | B33 | B34 | B35 | B36 | B37 | B38 | B39 |
| burst access 5: | B40 | B41 | B42 | B43 | B44 | B45 | B46 | B47 |
| burst access 6: | B48 | B49 | B50 | B51 | B52 | B53 | B54 | B55 |
| burst access 7: | B56 | B57 | B58 | B59 | B60 | B61 | B62 | B63 |

Thus when filled with a burst transaction, one of the 64-byte cache lines of the data cache 1000 can for example be represented as an 8×8 array, containing:

| B00 | B01 | B02 | B03 | B04 | B05 | B06 | B07 |
| B08 | B09 | B10 | B11 | B12 | B13 | B14 | B15 |
| B16 | B17 | B18 | B19 | B20 | B21 | B22 | B23 |
| B24 | B25 | B26 | B27 | B28 | B29 | B30 | B31 |
| B32 | B33 | B34 | B35 | B36 | B37 | B38 | B39 |
| B40 | B41 | B42 | B43 | B44 | B45 | B46 | B47 |
| B48 | B49 | B50 | B51 | B52 | B53 | B54 | B55 |
| B56 | B57 | B58 | B59 | B60 | B61 | B62 | B63 |

Inside such a cache line, the HCPU 202 is for example able to access: any byte; any 16-bit word, composed of two bytes {Bn, Bn+1}, where n is divisible by 2; a 32-bit word, composed of the bytes {Bn, Bn+1, Bn+2, Bn+3}, where n is divisible by 4; and a 64-bit word, composed of the 8 bytes of a row of the array.

In some embodiments, the bytes in a cache line of the data cache 1000 are subject to a permutation in order to modify the manner in which they are stored in the memory circuits. For example, instead of filling a cache line with the data as they arrive from the DDR data bus of the HCPU 202, the following permutation is performed: representing the cache line as an 8×8 array, each byte at the coordinate (x,y) is exchanged with the byte at the coordinate (y,x). Once permuted, the cache line is thus filled as follow:

| B00 | B08 | B16 | B24 | B32 | B40 | B48 | B56 |
| B01 | B09 | B17 | B25 | B33 | B41 | B49 | B57 |
| B02 | B10 | B18 | B26 | B34 | B42 | B50 | B58 |
| B03 | B11 | B19 | B27 | B35 | B43 | B51 | B59 |
| B04 | B12 | B20 | B28 | B36 | B44 | B52 | B60 |
| B05 | B13 | B21 | B29 | B37 | B45 | B53 | B61 |
| B06 | B14 | B22 | B30 | B38 | B46 | B54 | B62 |
| B07 | B15 | B23 | B31 | B39 | B47 | B55 | B63 |

The cache is always accessed using a physical global address space address, and thus the address conversion function DGAS2PGAS is changed to accommodate the byte permutation. As described above, the initial address conversion function was:

PGAS_address[25:0]={DGAS_address[22:0],DGAS_address[25:23]}

By permutating the byte inside the cache line, the PGAS address bits [2:0], which corresponds to address locations in the x direction in the 8×8 array, are exchanged with the PGAS address bits [5:3], corresponding to the y direction in the 8×8 array. Thus, the new address conversion becomes:

PGAS_address[25:0]={DGAS_address[22:3], DGAS_address[25:23], DGAS_address[2:0]}

It will be noted that the PGAS address bits [2:0] are now equal to the DGAS address bits [2:0]. Advantageously, this means that memory access operations addressing 16-bit, 32-bit and 64 bits values become possible. In particular, when reading from or writing to the cache line, it becomes possible to perform any of the following access operations:
- a 16-bit word, 16-bit aligned, formed of 2 bytes with consecutive DGAS addresses;
- a 32-bit word, 32-bit aligned, formed of 4 bytes with consecutive DGAS addresses; or
- a 64-bit word, 64-bit aligned, formed of 8 bytes with consecutive DAS addresses.

While the above description mentions memory accesses of a certain size, aligned with the same size, by using two cache lines at a time, unaligned 16-bit, 32-bit and 64-bit DGAS accesses can also be supported. In particular, this can for example be achieved by splitting an access that crosses adjacent cache lines into two successive accesses each involving a single cache line, or by performing simultaneous accesses to the two cache lines and then multiplexing the read data to extract the relevant portions.

The above example assumes that the permutation (x, y)→(y, x) is applied to a square cache line burst. Other permutations are also possible. For example, the permutation (x, y)→(y, ~x) could be used instead, where the symbol "~" means the 1's complement, in other words 7-x. The consequence is that the memory chip indexes are inverted.

The above example assumes that the memory burst is square, which is the case for the DDR3 and DDR4 protocols. However, other protocols involve a rectangular burst. For example the DDR2 protocol moves 8 bytes over 4 accesses. A similar permutation operation as described above can be applied to such a burst, as will now be described in more detail.

In the DDR2 context, the cache line has a size of 32-bytes, and when filled with a burst transaction, and represented as an 8×4 array, it contains:

| B00 | B01 | B02 | B03 | B04 | B05 | B06 | B07 |
| B08 | B09 | B10 | B11 | B12 | B13 | B14 | B15 |
| B16 | B17 | B18 | B19 | B20 | B21 | B22 | B23 |
| B24 | B25 | B26 | B27 | B28 | B29 | B30 | B31 |

Applying the (x,y)→(y,x) transformation, and representing the 32-byte cache line as a 4×8 array, we get:

| B00 | B08 | B16 | B24 |
| B01 | B09 | B17 | B25 |
| B02 | B10 | B18 | B26 |
| B03 | B11 | B19 | B27 |
| B04 | B12 | B20 | B28 |
| B05 | B13 | B21 | B29 |
| B06 | B14 | B22 | B30 |
| B07 | B15 | B23 | B31 |

Again, the address conversion function DGAS2PGAS is for example changed to accommodate this byte permutation. As described above, the initial address conversion function was:

PGAS_address[25:0]={DGAS_address[22:0],DGAS_address[25:23]}

It will be noted that this initial address permutation is the same as for the DDR3/DDR4 example, since this initial permutation depends only on the number of memory circuits in parallel, which is for example eight for both the DDR2 and DDR3/DDR4 examples.

The new permutation for DDR2 example is for example:
PGAS_address[25:0]={DGAS_address[22:2],DGAS_address[25:23], DGAS_address[1:0]}

The HCPU can for example perform the following read or write accesses:
- a 16-bit aligned, 16-bit access in DGAS; or
- a 32-bit aligned, 32-bit access in DGAS.

The 64-bit access in DGAS does not work because the DGAS linearity is only 4-bytes large, meaning that only the two least significant bits of the DGAS address are equal to the two least significant bits of the PGAS address.

While in the DDR2 example the width of the rectangular burst is larger than its depth, the transformations described herein could be applied equally to other burst configurations, for example where the width is smaller than the depth.

The above described permutation of the cache line can for example be performed in software or hardware.

In the case of a software permutation, the permutation can for example be performed over 36 cycles. This number of cycles can be compared with the cost of a random (closed page) DRAM access, which is generally over 200 cycles. Thus, the cost of a software permutation is relatively low.

Alternatively, in a hardware cache line permutation, the HCPU 202 for example comprises one or several permutation circuits. These circuits are for example implemented in the HCPU 202, or as part of a separate circuit coupled between the HCPU and the memory circuits. The permutation operation is not for example pipelined, as the whole of 8×8 array should be charged before the permutation starts.

The permutation circuit could be implemented using:
- dual-ported registers, with an orthogonal write bus and read bus; or
- a single ported memory, the entries of which are shift registers orthogonal to the memory bus;

a 2D array of shift registers, with shift possible in one dimension, and then in the other direction.

An example implementation of a permutation circuit will now be described with reference to FIGS. 10C to 10E based on an example in which the cache line comprises 16 bytes b0 to b15. It will be apparent to those skilled in the art how this implementation could be adapted to other sizes of cache line, such as the 32 and 64 byte examples described above.

FIGS. 10C to 10F illustrates a permutation circuit 1001 for performing cache line permutations during a read operation of a cache line from the data cache. Of course, the inverse operations could be performed when writing a cache line to the cache.

The permutation circuit 1001 for example comprises registers 1002, 1004, 1006 and 1008, which are for example shift registers. As shown in FIG. 10C, the register 1002 has an input line coupled to receive bytes b0, b4, b8 and b12 of a cache line, the register 1004 has an input line coupled to receive bytes b1, b5, b9 and b13 of a cache line, the register 1006 has an input line coupled to receive bytes b2, b6, b10 and b14 of a cache line, and the register 1008 has an input line coupled to receive bytes b3, b7, b11 and b15 of a cache line.

Figure 10B:
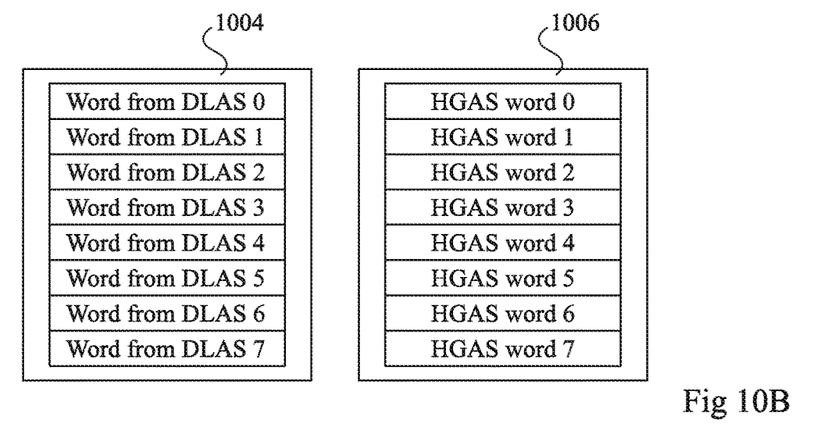
FIG. 10B schematically illustrates an example of cache line data storage in address spaces of FIG. 4 according to an example embodiment.
Figure 10C:
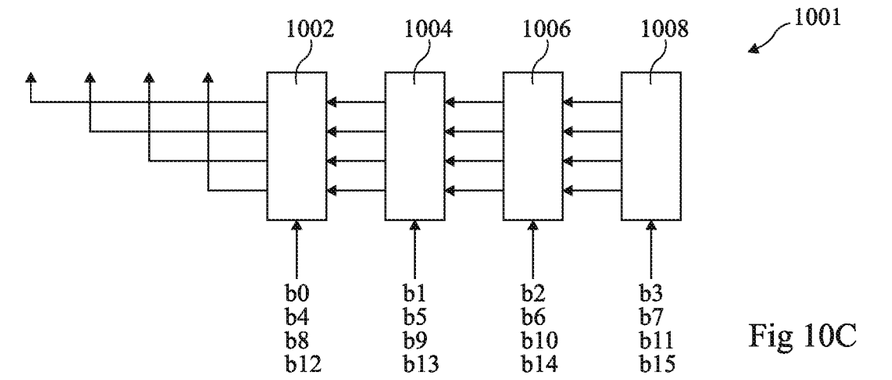
FIGS. 10C to 10F schematically illustrate a cache line permutation circuit during operation according to an example embodiment.
Figure 10D:
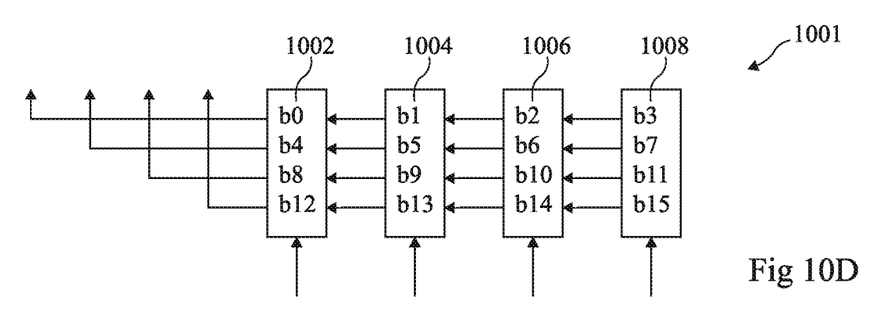

FIG. 10D illustrates the permutation circuit 1001 after the bytes b0 to b15 have been loaded into the registers 1002 to 1008, for example by shift operations.

Figure 10E:
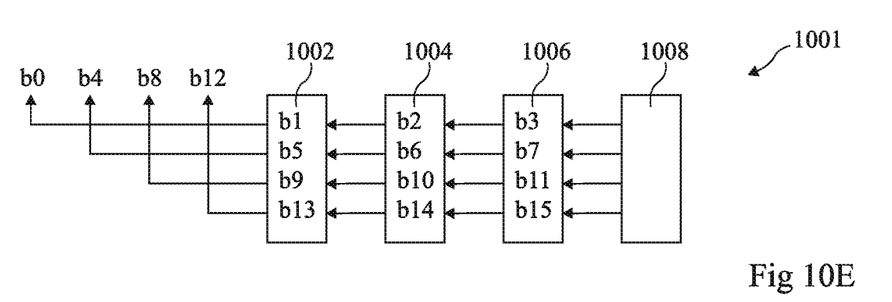

FIG. 10E illustrates a first output operation during which the bytes b0, b4, b8 and b12 loaded into the register 1002 are output in parallel to form a first row of the permutated cache line. At the same time, the bytes from the register 1004 are shifted to the register 1002, the bytes from the register 1006 are shifted to the register 1004 and the bytes from the register 1008 are shifted to the register 1006.

Figure 10F:
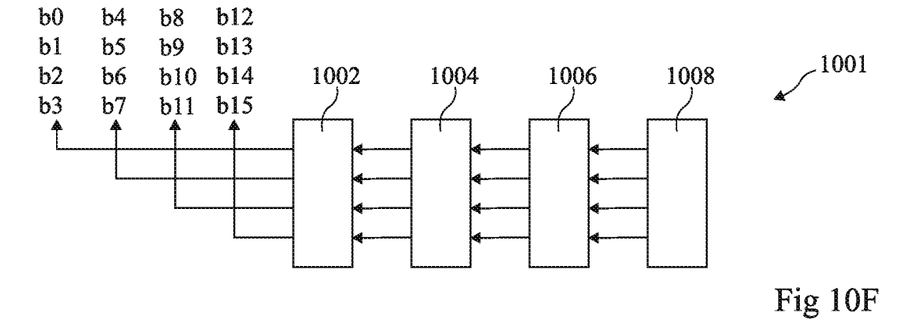

The output and shift operations represented in FIG. 10E are then repeated until, as shown in FIG. 10F, all of the bytes have been outputted from the registers 1002 to 1008 to form the permutated cache line.

The initial loading of the data to the registers 1002 to 1008 may be performed by shift operations using shift registers as mentioned above, or by memory write operations to the registers. Furthermore, while in the example described in relation to FIGS. 10E and 10F the data values are output from the registers 1002, 1004, 1006, 1008 by performing shift operations, in alternative embodiments the data could be output by memory read operations.

In some embodiments, the cache line permutation may be performed for all memory accesses, irrespectively of whether or not they concern a memory circuit having an integrated DPU. Indeed, the orientation in which a cache line is written in the memory system is generally of no consequence, and therefore performing the permutation on all data would be possible. In such a case, the cache line byte permutation could be performed by a modification to the way cache lines are loaded from or written to the DDR2, DDR3 or DDR4 bus. Address conversion is still for example performed for DGAS addresses.

Indeed, with reference to FIG. 10B, when reading from the DGAS 1004, a 64-byte cache line contains 8×64-bit words, each of these words belonging to a different DLAS. Thus these 8 words are not mapped contiguously in DGAS, and are for example separated by 8 MB in the case that the memory system is of 64 MB provided by 8 memory circuits. When reading from the HGA 1006, a 64-byte cache line contains 8×64-bit words, and the 8 words are mapped contiguously in the HGAS.

The transformation flow will now be described in more detail with reference to FIG. 11.

Figure 11:
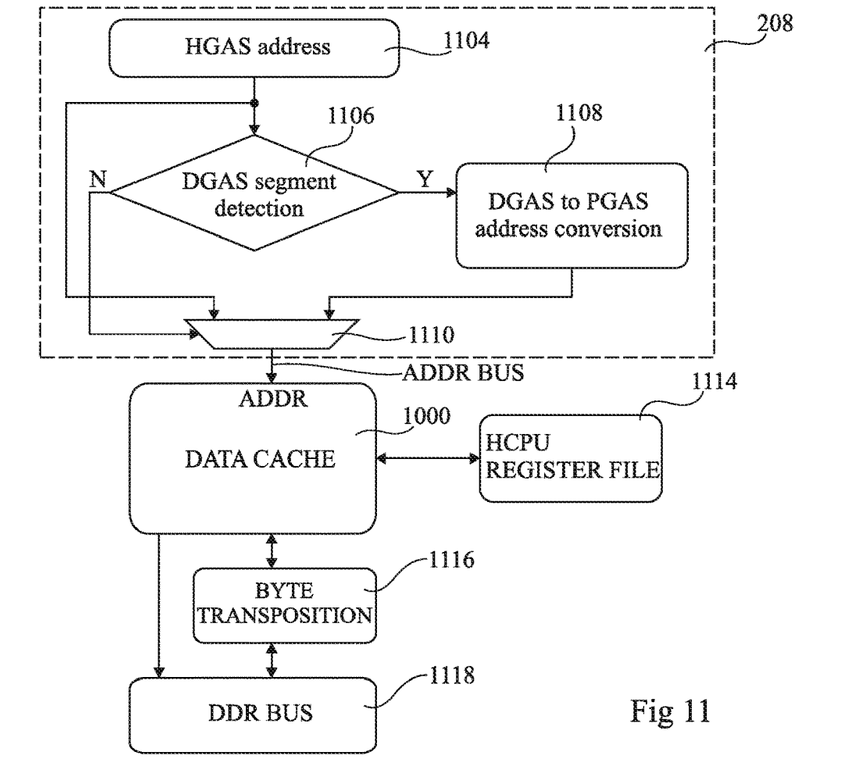
FIG. 11 schematically illustrates circuits of a computing device according to an example embodiment of the present disclosure.

FIG. 11 illustrates part of the computing device 200 comprising the cache 1000 of FIG. 10A and the address conversion function 208 of FIG. 2. The circuits of FIG. 11 are for example all integrated within the HCPU 202.

The address conversion function 208 is for example implemented in hardware or software. This function is represented in FIG. 11 by a flow formed of several operations. The conversion is based on an HGAS address, which is to be target of the data cache access operation. In an operation 1106, it is determined whether the HGAS address corresponds to a DGAS segment. If so, in a next operation 1108, the DGAS to PGAS address conversion is performed, for example based on one of the DGAS2PGAS functions described above, depending on the type of memory burst operation. A multiplexer 1110 for example selects the converted address in the case that the HGAS address does correspond to a DGAS segment, or otherwise selects the HGAS address, to form the PGAS address for addressing the cache 1000. The address is supplied on an address bus (ADDR BUS) to an address port (ADDR) of the data cache 1000.

The data cache 1000 is coupled to an HCPU register file 1114 of the HCPU 202. The HCPU register file 1114 is for example the general purpose register file accessible by instructions executed by the HCPU 202. The data cache is filled with data via a byte transposition circuit (BYTE TRANSPOSITION) 1116, which is for example implemented by a circuit similar to the permutation circuit 1001 of FIGS. 10C to 10F. The byte transposition circuit 1116 is for example coupled between the DDR data bus (DDR BUS) 1118 and the data cache 1000. However, in alternative embodiments it could be positioned elsewhere, such as in the path between the data cache 1000 and the HCPU register file 1114.

In some embodiments, rather than using a cache line permutation circuit such as the byte transposition circuit 1116 to perform cache line permutations, as mentioned above this could instead be performed in software, by reading and writing bytes between the memory circuits and the data cache. Thus, 16-bit, 32-bit, and 64-bit writes are in fact converted into 8-bit write sequences, which breaks the granularity of these write operations. A standard 16-bit, 23-bit, or 64-bit access that is aligned with its own size will have some granularity, but when only some bits are written in a given write operation, the granularity is broken. Indeed, following each write operation, all bytes concerned by the write operation must be written, as otherwise the atomicity of the system is compromised. Indeed, the atomicity is broken if, following any given write operation, a data word contains some bytes that have already been written, and others bytes that are waiting to be written. For example, a command register having a width wider than the width of the data port of a memory circuit may be mapped into the DGAS. If this command register is only partially written, the command becomes meaningless. This problem is for example addressed by including at least one control bit within the command register indicating when the command is valid. The control bit is included in a final byte of the command register to be written, and is for example inverted during each write operation. In this way, the HCPU will only take into account a command read from this command register once the control bit changes colour, in other words once it has been inverted, with respect to the previous command.

In some embodiments, the data stored in the memory circuits 204 may include error correcting code (ECC), as will now be described with reference to FIGS. 12 and 13.

Figure 12:
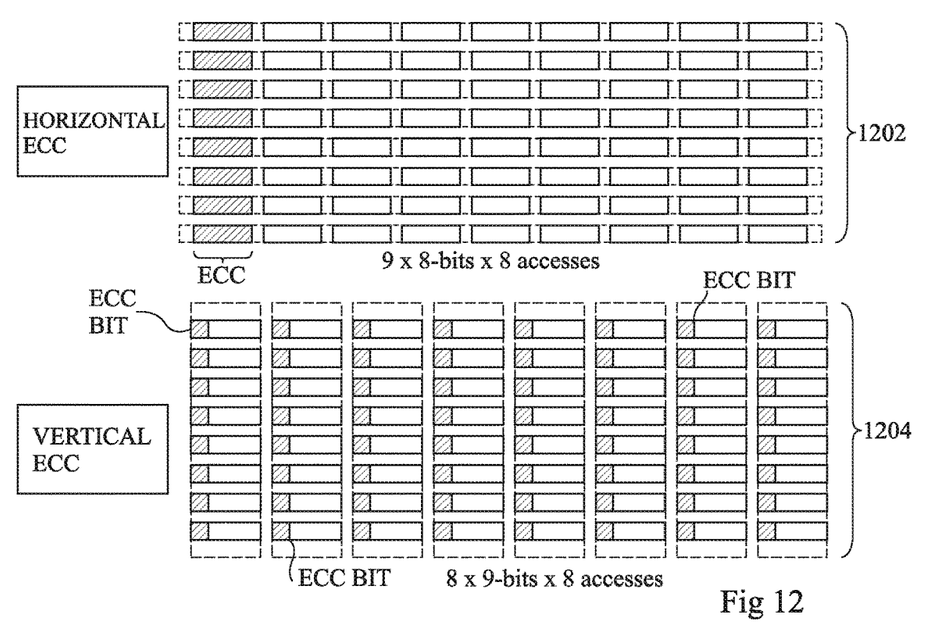
FIG. 12 schematically represents horizontal and vertical storage of error correction codes in memory circuits according to an example embodiment.

FIG. 12 schematically represents horizontal and vertical storage of error correction codes in the memory circuits 204 according to an example embodiment.

A block 1202 in FIG. 12 represents the horizontal storage. Each data byte is represented by an empty rectangle, the data being stored across eight memory circuits represented by the eight columns of rectangles. A ninth memory circuit is for example added to store, for each horizontal row of data, the associated ECC bits. However, as each internal DPU of a memory circuit may modify the data stored by that memory circuit, each memory circuit should be able to access and modify the ECC data when the data changes. This is not possible in the horizontal storage arrangement. Furthermore, because each ECC value is associated with a horizontal row of bytes, each memory circuit would also need to have access to the data stored by other memory circuits in order to check and recalculate an EEC value.

A block 1204 in FIG. 12 represents the vertical storage. As represented by a shaded portion associated with each data byte, the ECC bits associated with a vertical column of bytes of a column are distributed among those bytes. For example, one or more additional storage cells is provided for each byte in order to store one or more additional bits of ECC. The data port of the memory circuit is likewise enlarged by the same number of bits. The DPU of a memory circuit is thus able to reconstruct the ECC by combining the ECC bit or bits stored with each byte in a certain number of sub-words in the same column. For example, there are i bits of ECC associated with each byte, and the ECC comprises ixj bits, in other words the ECC bits associated with j bytes of a column, where i is for example equal to one or more, and j is for example equal to at least two. In this embodiment, the HCPU 202 for example comprises a single ECC circuit for generating the ECC bits from a group of eight bytes, and then these bits are distributed among the bytes. For example, the HCPU comprises an ECC circuit associated with each memory circuit so that ECC values can be calculated in parallel. Each memory circuit that integrates a DPU also for example comprises an ECC circuit for verifying ECC bits, and generating new ECC bits every time a data value is modified.

Figure 13:
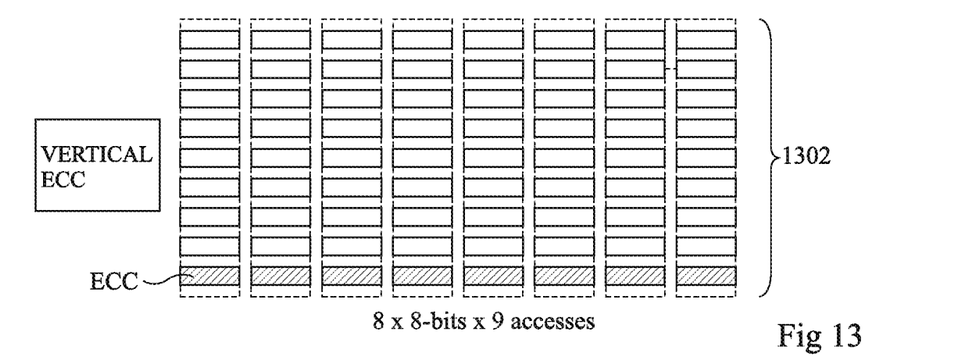
FIG. 13 schematically represents horizontal and vertical storage of error correction codes in memory circuits according to a further example embodiment.

FIG. 13 schematically represents a block 1302 representing an alternative vertical storage scheme of ECC bits. In the example of FIG. 13, the ECC bits associated with j rows of bytes of a given column are stored in an additional row dedicated to storing the ECC data. The ECC bits can thus be accessed by performing an additional read or write operation. For example, the burst length is extended from 8 to 9 accesses. In this embodiment, the HCPU 202 for example comprises a number of ECC circuits equal to the number of bytes in each access. Thus, in the example of FIG. 13 in which each access comprises eight bytes, the HCPU 202 for example comprises eight ECC circuits operating in parallel. Each memory circuit that integrates a DPU also for example comprises an ECC circuit for verifying ECC bits, and generating new ECC bits every time a data value is modified.

Figure 14:
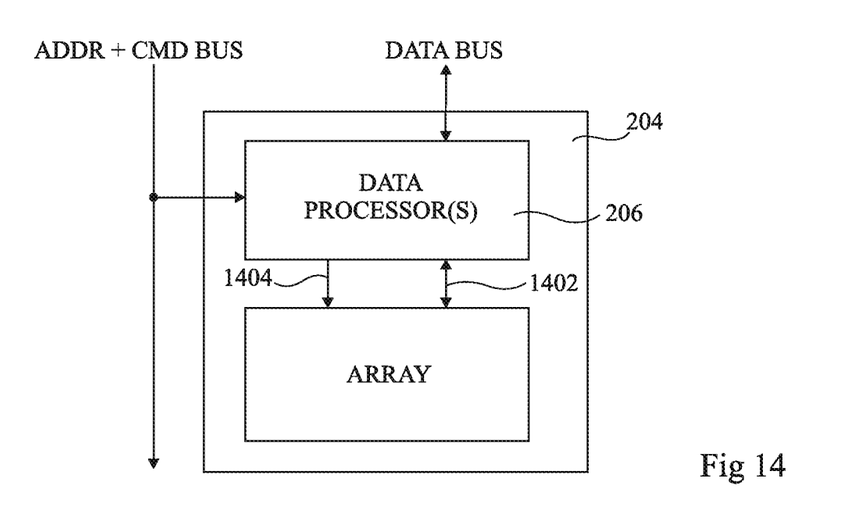
FIG. 14 schematically illustrates a memory circuit in more detail according to a further example embodiment.

FIG. 14 schematically illustrates one of the memory circuits 204 of FIG. 2 in more detail according to an example embodiment in which the DPU 206 is not integrated directly in the integrated circuit chip containing the memory array (ARRAY), but in a separate integrated circuit chip coupled to the memory array by a data bus 1402 and an address bus 1404. The DPU 206 for example comprises one or more data processors (DATA PROCESSOR(S)) coupled to the address and command bus (ADDR+CMD BUS) and a slice of the data bus (DATA BUS) of the HCPU 202.

An advantage of the embodiments described herein is that, but providing address conversion, data words can be stored vertically in a single memory circuit having a data port of narrower width than the data word. Thus a data processing device of the memory circuit is capable of accessing the data words, and performing operations on the data words.

Having thus described at least one illustrative embodiment, various alterations, modifications and improvements will readily occur to those skilled in the art. For example, it will be apparent to those skilled in the art that while specific embodiments have been described based on an HCPU data bus that is 64 bits wide, and one or more ranks of eight memory circuits having 8-bit data ports, many different arrangement would be possible.

Furthermore, while in the example embodiments described herein each memory circuit corresponds to an integrated circuit having one or more integrated DPUs, in alternative embodiments the one or more DPUs could be formed in one or more further integrated circuits separate from the memory circuit.

The invention claimed is:

1. A computing device comprising:
a processor;
a plurality of memory circuits, each memory circuit of the plurality of memory circuits having a data port that is m bits wide, where m is a nonzero integer; and
a data bus coupling the processor to each of the memory circuits, wherein the data bus has a width of n bits, where n is a nonzero integer and is larger than m, the data port of each of the memory circuits being individually and separately coupled to a corresponding m-bit slice of the data bus, the data port of each of the memory circuits being directly coupled to and in direct communication with the corresponding m-bit slice of the data bus without any intervening devices connected between the data port of each of the memory circuits and the corresponding m-bit slice of the data bus, the processor being adapted to provide one or more first addresses for an n-bit data value to be read or written via the data bus into the plurality of memory circuits;
wherein at least one memory circuit of the memory circuits comprises one or more further processors capable of:
  accessing data words of the at least one memory circuit, the width m of the data port of at least one memory circuit being less than a width of the data words, and
  performing operations en the data words; wherein the processor is configured to read or write the n-bit data value from or to the at least one memory circuit by:
    converting the one or more first addresses into a plurality of second addresses corresponding to m-bit memory locations in the at least one memory circuit, at least two of the plurality of second addresses being contiguous addresses; and
    performing a read or write operation of the n-bit data value in the at least one memory circuit over a plurality of memory access operations.

2. The computing device of claim 1, wherein each processor of the one or most further processors is configured to perform data processing operations stored by the at least one memory circuit based on commands provided by the processor.

3. The computing device of claim 1, wherein the width n of the data bus is a multiple p of the width m of the data port of each memory circuit of the memory circuits, and wherein an amount of the memory circuits is equal to the multiple p, where p is a nonzero integer.

4. The computing device of claim 1, wherein the address conversion comprises an address permutation such that one or more of the most significant bits of the one or more first addresses become one or more least significant bits of the plurality of second addresses designating the at least one memory circuit.

5. The computing device of claim 1, wherein the one or more first addresses are addresses in an address space of the processor, and the plurality of second addresses are addresses in a local address space of the one or more further processors, wherein the local address space is linear or linear by segment.

6. The computing device of claim 1, further comprising a data cache, and a data permutation circuit adapted to perform a cache line permutation on one or more lines of the data cache, the data cache having cache lines each strong a plurality of data words, each data word comprising a plurality of bytes of data, and wherein the cache line permutation stores the bytes forming a data word of the data words in storage locations of the cache associated with the at least one memory circuit.

7. The computing device of claim 6, wherein the data cache is coupled to the memory circuits via the data bus, and wherein the data permutation circuit is a byte transposition circuit coupled between the data bus and the data cache and adapted to perform the cache line permutation of each data value stored to or loaded from the cache.

8. The computing device of claim 1, wherein the processor is adapted to determine whether the one or more first addresses falls within an address segment associated with one or more of the one or more further processors, and to perform the address conversion when the one or more first addresses falls within the address segment.

9. The computing device of claim 1, wherein a plurality of least significant bits of the one or more first addresses is identical to a plurality of least significant bits of one of the plurality of second addresses.

10. The computing device of claim 1, wherein a command register of more than m bits is mapped to the address space of the at least one memory circuit the command register comprising at least e control bit, wherein the processor is adapted to perform a write operation to the command register over a plurality of memory access operations, a byte of the command register comprising the control bit being written by a final one of the memory access operations and involving a modification of the control bit.

11. The computing device of claim 1, wherein the at least one memory circuit is an integrated circuit ship integrating a memory array and the one or more further processors.

12. The computing device of claim 1, wherein the at least one memory circuit comprises an integrated circuit chip comprising a memory array and a further integrated circuit chip comprising the one or more further processor.

13. The computing device of claim 12, wherein the at least one memory circuit comprises one or more further processors each associated with a corresponding address space of the memory array.

14. The computing device of claim 1, wherein the processor comprises one or more error correction code circuits adapted to insert one or more ECC bits into each m-bit value.

15. The computing device of claim 1, wherein the processor comprises one or more error correction code circuits adapted to generate ECC bits to be stored to the at least one memory circuit during a further memory access operation.

16. A method comprising:
performing by a processor, a read or write operation at one or more first addresses of an n-bit data value to or from a plurality of memory circuits via a data bus individually coupling the processor to each of the memory circuits, wherein each of the memory circuits has a data port that is m bits wide and the data bus has a width of n bits, where n is larger than m ad n and m are nonzero integers, the data port of each of the memory circuits being directly coupled to an in direct communication with a corresponding m-bit slice of the data bus without any intervening devices connected between the data port of each of the memory circuits and the corresponding m-bit slice of the data bus,
wherein at least one memory circuit of the memory circuits comprises one or more further processors capable of:
accessing data words of the at least one memory circuit, the width m of the data part of the at least one memory circuit being less than a width of she data word, and
performing operations on the data words; and
wherein the read or write operation comprises:
provision, by the processor of the one or more first addresses;
conversion of the one more first addresses into a plurality of second addresses corresponding to m-bit memory locations in the at least one memory circuit, at least two of the plurality of second addresses being contiguous addresses; and
performance of the read or write operation of the n-bit data value to the at least one memory circuit over a plurality of memory access operations.

17. The method of claim 16, further comprising the performance by the processor of a cache line permutation on one or more lines of a data cache, the data cache having cache lines each strong a plurality of data words, each data word comprising a plurality of bytes of data, and wherein the cache line permutation stores the bytes forming a data word of the data words in storage locations of the cache associated with the at least one memory circuit.

18. A non-transitory computer readable storage medium for storing computer program instructions which, when executed by the processor, lead to the implementation of the method of claim 17.

19. A computing device comprising:
a first processor;
a plurality of memory circuits; and
a data bus coupling the processor to each of the memory circuits, wherein each of the memory circuits has a data post that is m bits wide and the data bus has a width of n bits, where n is larger than m and n and m are nonzero integers, the data port of each of the memory circuits being individually and separately coupled to a corresponding m-bit slice of the data bus, the m-bit slice of each of the memory circuits collectively equaling the width of the n bits of the data bus, the processor being adapted to provide one or more first addresses for an n-bit data value to be read or written via the data bus into the plurality of memory circuits;
wherein at least one memory circuit of the memory circuits comprises at least one further processor capable of:
accessing data words of the at least one memory circuit, the width m of the data port of the at least one memory circuit being less than a width of the data words, and performing operations on the data words; wherein the processor is configured to read or write the n-bit data value from or to the at least one memory circuit by:
converting the one or more first addresses into a plurality of second addresses corresponding to m-bit memory locations in the at least one memory circuit, at least two of the plurality of second addresses being contiguous addresses; and
performing a read or write operation of the n-bit data value in the at least one memory circuit over a plurality of memory access operations.

* * * * *